(12) United States Patent
Yu et al.

(10) Patent No.: US 7,417,891 B2
(45) Date of Patent: Aug. 26, 2008

(54) PHASE CHANGE MEMORY DEVICE HAVING SEMICONDUCTOR LASER UNIT

(75) Inventors: Byoung Gon Yu, Daejeon (KR); Seung Yun Lee, Daejeon (KR); Sangouk Ryu, Daejeon (KR); Sung Min Yoon, Daejeon (KR); Young Sam Park, Daejeon (KR); Kyu Jeong Choi, Daejeon (KR); Nam Yeal Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 92 days.

(21) Appl. No.: 11/635,279

(22) Filed: Dec. 7, 2006

(65) Prior Publication Data

US 2007/0133272 A1    Jun. 14, 2007

(30) Foreign Application Priority Data

Dec. 8, 2005    (KR) .................. 10-2005-0120100
Sep. 6, 2006    (KR) .................. 10-2006-0085826

(51) Int. Cl.
*G11C 11/00* (2006.01)

(52) U.S. Cl. ........................ 365/163; 365/148
(58) Field of Classification Search .......... 365/163, 365/148; 372/43.01–50.23, 50.124, 101, 372/103
See application file for complete search history.

(56) References Cited

U.S. PATENT DOCUMENTS 5,831,960 A * 11/1998 Jiang et al. ............. 369/121
6,834,027 B1 * 12/2004 Sakaguchi et al. ....... 369/13.32

FOREIGN PATENT DOCUMENTS

| JP | 2002-279710 | 9/2002 |
| JP | 2005-244235 | 9/2005 |
| KR | 1020040045636 | 6/2004 |

* cited by examiner

*Primary Examiner*—Richard T. Elms
*Assistant Examiner*—Harry W Byrne
(74) *Attorney, Agent, or Firm*—Ladas & Parry LLP

(57) ABSTRACT

Provided is a phase change memory device including: a phase change memory unit comprising a phase change layer pattern; a laser beam focusing unit locally focusing a laser beam on the phase change layer pattern of the phase change memory unit; and a semiconductor laser unit generating and emitting the laser beam towards the laser beam focusing unit. Thus set or reset operations in the phase change memory device uses laser beams locally applied, thereby reducing the consumption power and preventing destruction or change in information stored in neighboring cell during the operations of unit cell.

9 Claims, 4 Drawing Sheets

PHASE CHANGE MEMORY DEVICE HAVING SEMICONDUCTOR LASER UNIT

CROSS-REFERENCE TO RELATED PATENT APPLICATION

This application claims the benefit of Korean Patent Application Nos. 10-2005-0120100 and 10-2006-0085826, filed on Dec. 8, 2005 and Sep. 6, 2006, respectively, in the Korean Intellectual Property Office, the disclosure of which are incorporated herein in their entirety by reference.

BACKGROUND OF THE INVENTION

1. Field of the Invention

The present invention relates to a memory device, and more particularly, to a phase change memory device.

2. Description of the Related Art

In general, memory devices are classified into volatile and non-volatile memory devices. Volatile memory devices lose stored information when the power is cut off. In contrast, nonvolatile memory devices do not lose stored information when the power is cut off. Dynamic random access memory (DRAM) is an example of one type of volatile memory devices. Volatile memory devices require a refresh operation to be performed during operation. The refresh operation is performed to restore stored information, which is lost due to generation of a leakage current of a memory device, after intervals separated by a predetermined period of time. Thus the disadvantage of volatile memory devices is the large consumption power.

When volatile memory devices can be replaced with non-volatile memory devices, reduction in consumption power is expected and thus a few types of nonvolatile memory devices are being used or researched. Most of the nonvolatile memory devices currently being used are flash memory devices. However, flash memory devices have low operation speeds, require relatively high voltages, and have a characteristic such that they are not reliable during re-writing operations, thus are used exclusively in mobile appliances such as digital cameras or mobile phones.

A phase change memory (PRAM) has been strongly suggested as the next-generation of nonvolatile memory device to replace flash memory devices. A phase change memory device uses a phase change layer, the resistivity of which changes according to the crystalline state. The phase change memory device stores information by controlling the crystalline state of the phase change layer by applying electric joule heat due to a current or a voltage to the phase change layer under appropriate conditions. The phase change memory device performs a set operation by changing the phase change layer from an amorphous state having a high resistance to a crystalline state having a low resistance (on-state, logical value of "0"), and performs a reset operation by changing the phase change layer from the crystalline state having a low resistance to the amorphous state having a high resistance (off-state, logical value "1"). The information stored in the phase change memory can be read by measuring the change in the resistance value due to the crystalline state of the phase change layer.

However, the phase change memory device needs to satisfy following conditions to be selected as a next-generation nonvolatile memory device.

First, the phase change memory device currently requires relatively large consumption power since the phase change memory device is driven by controlling the crystalline state of the phase change material using the electric joule heat which is generated when a current or a voltage is applied to the phase change layer. Thus the consumption power needed for driving the phase change memory device should be significantly reduced in order for phase change memory devices to be used practically.

Second, when the crystalline state of unit cells of the phase change memory device are changed, information stored in neighboring cells should not be destroyed or changed by the electric joule heat. This is of particular significance as the distance between the memory cells in the memory cell array of the phase change memory device having high integration degree is continuously being reduced. The electric joule heat generated when a predetermined cell is operated should not be an impeding factor for the operation of neighboring cells.

SUMMARY OF THE INVENTION

The present invention provides a phase change memory device with significantly reduced consumption power, wherein information stored in neighboring cells of a unit cell during set and reset operations of the unit cell is neither destroyed nor changed.

According to an aspect of the present invention, there is provided a phase change memory device comprising a phase change memory unit comprising a phase change layer pattern, a laser beam focusing unit locally focusing a laser beam on the phase change layer pattern of the phase change memory unit; and a semiconductor laser unit generating and emitting the laser beam towards the laser beam focusing unit.

The phase change memory unit, the laser beam focusing unit, and the semiconductor laser unit may be sequentially stacked and coupled. A laser beam shielding pattern having a laser beam window may be formed on the phase change layer pattern, wherein the laser beam window allows a laser beam to pass therethrough. The laser beam focusing unit may include a microprobe that can locally focus a laser beam on the phase change layer pattern. The semiconductor laser unit may include a laser beam controlling pattern that can control the shape of an emitted laser beam.

According to another aspect of the present invention, there is provided a phase change memory device comprising an electrode having a contact hole formed to on a first substrate, a phase change layer pattern that is formed in the contact hole and is electrically connected to the electrode, a laser beam shielding pattern that is formed on the phase change layer pattern and the electrode and comprises a laser beam window to allow a laser beam to be locally incident on the phase change layer pattern, a second substrate that is supported on and coupled to both ends of the laser beam shielding pattern and comprises a microprobe that can allow the laser beam to be transmitted through the laser beam window; and a third substrate that is supported on and coupled to a rear surface of the second substrate and comprises a semiconductor layer which generates and emits a laser beam through a laser beam controlling pattern to the microprobe.

A connecting plate, which exposes a portion of the laser beam controlling pattern corresponding to the microprobe, may be installed between the second substrate comprising the microprobe and the third substrate comprising the semiconductor laser. An inner cavity may be formed inside the second substrate, and the microprobe protrudes into the middle of the inner cavity, and contact pads are formed at both end portions of the inner cavity. A protection layer pattern may be further formed, which can adjust the distance between the first substrate and the second substrate.

The semiconductor laser may include an active region formed on the third substrate and a first resonating mirror and a second resonating mirror disposed above and below the active region, and the laser beam controlling pattern is formed on the second resonating mirror.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
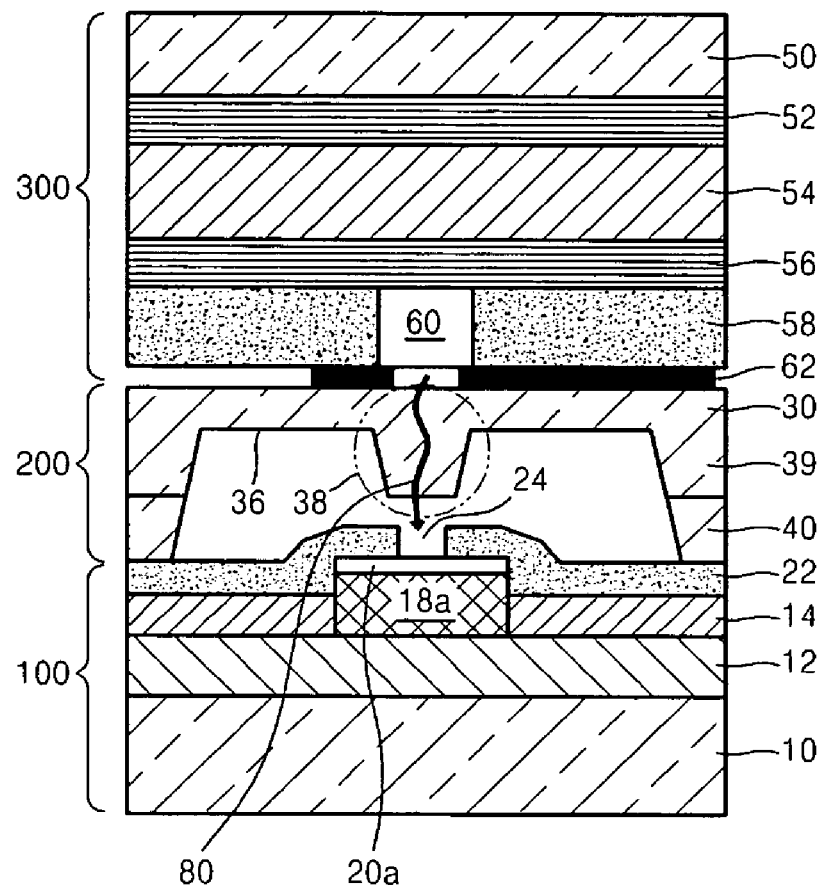
FIG. 1 is a cross-sectional view illustrating a phase change memory device, in which a semiconductor laser unit is built in, according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

A phase change memory device according to an embodiment of the present invention includes a semiconductor laser unit in each unit cell and uses a laser beam in each unit cell to apply heat to local portions of the phase change layer pattern to perform a set operation or a reset operation. Accordingly, since the phase change memory device uses laser beams applied locally, the consumption power is reduced and information stored in neighboring memory cells is not destroyed or changed by the heat which is generated during the operation of the unit cells and might affect neighboring cells. In particular, as only detection of the information stored in the unit cells of the phase change memory device according to the current embodiment of the present invention is performed, thus the phase change memory device according to the current embodiment of the present invention does not require complicated structures such as a heat generation layer and can be manufactured simply.

Hereinafter, a phase change memory device in which a semiconductor laser is mounted and a method of manufacturing the phase change memory device will be described. The phase change memory device that will be described hereinafter may be formed as an array in which a plurality of unit cells are formed on a substrate, but here, one unit cell will be described for convenience of description. In addition, the phase change memory device according to the current embodiment of the present invention applies a laser beam locally to a phase change layer pattern, and any structure that can realize the above function belongs to the scope of the present invention.

FIG. 1 is a cross-sectional view illustrating a phase change memory device in which a semiconductor laser unit is mounted according to an embodiment of the present invention.

In detail, the phase change memory device according to the current embodiment of the present invention, that is, a unit cell of the phase change memory device includes a phase change memory unit 100, a laser beam focusing unit 200, and a semiconductor laser unit 300 (semiconductor laser) which are sequentially stacked and coupled. The phase change memory unit 100 includes a phase change layer pattern 18a, can have information stored thereon through set or reset operations, and stored information can be read therefrom. The laser beam focusing unit 200 is disposed on the phase change memory unit 100 and locally focuses a laser beam 80 on the phase change layer pattern 18a of the phase change memory unit 100. The semiconductor laser unit 300 is disposed on the laser beam focusing unit 200 and generates and emits a laser beam 80 towards the laser beam focusing unit 200.

The phase change memory unit 100 includes a transistor (not shown) formed on a first substrate 10, and an insulating layer 12 formed on the upper portion of the transistor. A phase change layer pattern 18a and an electrode 14 are formed on the insulating layer 12. The phase change layer pattern 18a is a germanium(Ge)-antimony(Sb)-tellurium(Te) chalcogenide metal alloy layer (GST layer). The surface of the phase change layer pattern 18a is formed higher than the surface of the electrode 14. Reading of the information stored in the phase change memory device is performed by measuring the resistance between either end of the electrode 14.

A phase change layer protection pattern 20a protecting the phase change layer pattern 18a is formed on the phase change layer pattern 18a. A laser beam shielding pattern 22 having a first laser beam window 24 exposing a portion of the phase change protection layer 20a is formed on the electrode 14 and the phase change protecting layer 20a. The laser beam 80 is locally incident on the phase change layer pattern 18a through the first laser beam window 24 which is disposed in the laser beam shielding pattern 22.

The laser beam focusing unit 200 is formed of a second substrate 30 having an inner cavity 36 (or inner hole) formed in the lower portion of the laser beam focusing unit 200. A microprobe 38 corresponding to the first laser beam window 24 is formed protruding into the center of the inner cavity 36, and contact pads 39 protrude from both ends of the inner cavity 36.

In particular, the microprobe 38 corresponding to the first laser beam window 24 is disposed protruding into the center of the second substrate 30. The microprobe 38 locally focuses the laser beam 38 on the phase change layer pattern 18a through the first laser beam window 24 of the phase change memory unit 100. Set or reset operations are performed by the laser beam 80.

A protecting layer pattern 40 is formed on the contact pad 39 and is supported by and connected to the laser beam shielding pattern 22. The protecting layer 40 is formed between the surfaces of the microprobe 38 and the laser beam shielding pattern 22 to adjust the distance between the first substrate 10 in which the phase change layer pattern 18a is formed and the second substrate 30 in which the microprobe 38 is formed. The second substrate 30 including the microprobe 38 and the contact pad 39 is supported by and coupled to both ends of the laser beam shielding pattern 22.

The semiconductor laser unit 300 may be a vertical cavity surface emitting laser (VCSEL) emitting a laser beam through a surface thereof. The semiconductor laser unit 300 emits the laser beam 80 vertically. The semiconductor laser unit 300 includes an active zone 54 including quantum wells on an upper side of a third substrate 50, and a first resonating mirror 52 and a second resonating mirror 56 which are disposed above and below the active zone 54. The first resonating mirror 52 and the resonating mirror 56 have a multi-layer structure in which various layers having different refractive indices are alternately disposed and which has a reflectivity of 99% or more. The laser beam 80 generated in the active zone 54 is reflected by the first and second resonating mirrors 52 and 56 and amplified.

A semiconductor layer 58 is formed on the second resonating mirror 56 and a laser beam controlling pattern 60 is formed in the semiconductor layer 58. The laser beam controlling pattern 60 transmits the laser beam 80 to the microprobe 38 to control the shape of the laser beam 80. A connecting plate 62 is formed having a second laser beam window 64 (shown in FIG. 11) which corresponds to the microprobe 38 on the laser beam controlling pattern 60. The connecting plate 62 connects the second substrate 30 forming the laser beam focusing unit 200 and the semiconductor laser unit 300. In other words, the semiconductor laser unit 300 is supported by and coupled to a rear surface of the second substrate 30 by the connecting plate 62.

The phase change memory device performs set or reset operations using the laser beam 80 oscillating from the semiconductor laser unit 300 through the laser beam focusing unit 200 to radiate thermal energy locally to the phase change layer pattern 18a of the phase change memory unit 100 to change the crystalline state of the phase change layer pattern 18a. Also, the phase change memory device according to the current embodiment of the present invention reads the stored information from the change in resistance of the phase change layer pattern 18a due to the crystalline state thereof.

Since only the resistance of the phase change memory unit 100 of the phase change memory device according to the current embodiment of the present invention is detected in order to read information, no heat generation layer is required, as in the case of a conventional device, and thus the structure is very simple and consumption power thereof can be reduced. Also, the phase change memory device according to the present invention uses the laser beam 80 to perform set and reset operations, and thus heat generation by a current flowing locally can be removed and thus neighboring cells are not affected by the heat generated during the operation of a unit cell.

Figure 4:
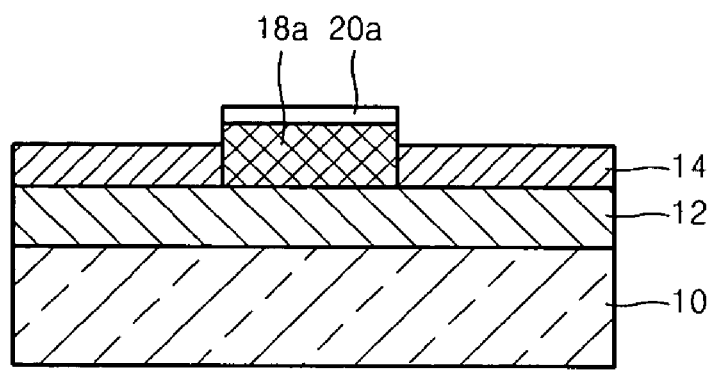
Figure 5:
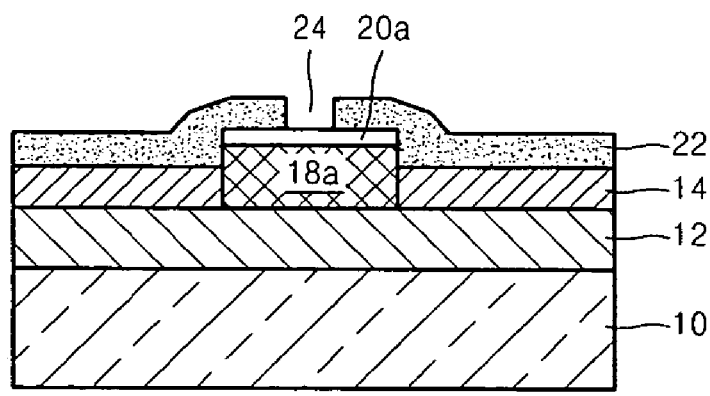
Figure 6:
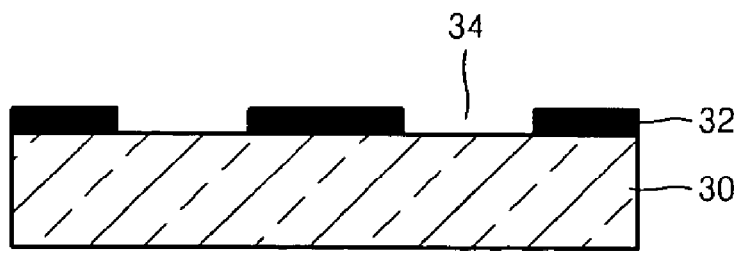
FIGS. 6 through 8 are cross-sectional views for illustrating a method of manufacturing a laser beam focusing unit of FIG. 1.
Figure 7:
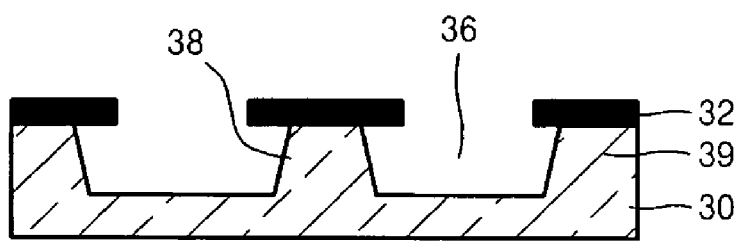
Figure 8:
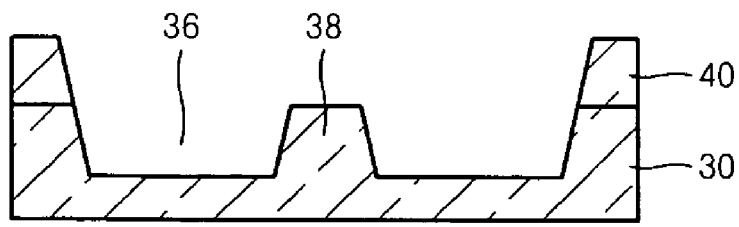
Figure 9:
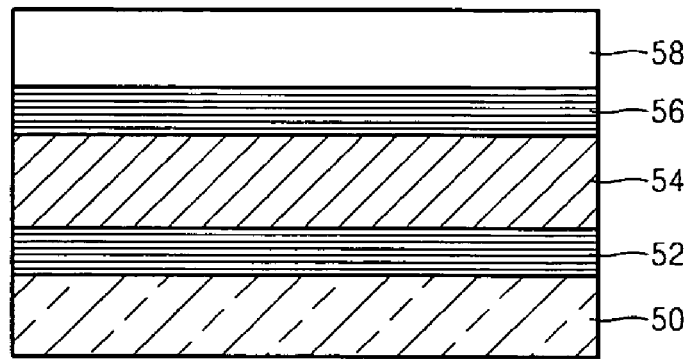
FIGS. 9 through 11 are cross-sectional views for illustrating a method of manufacturing a semiconductor laser unit of FIG. 1.
Figure 10:
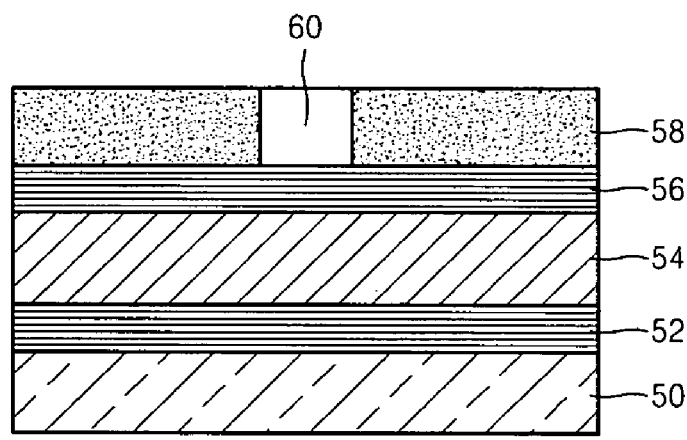
Figure 11:
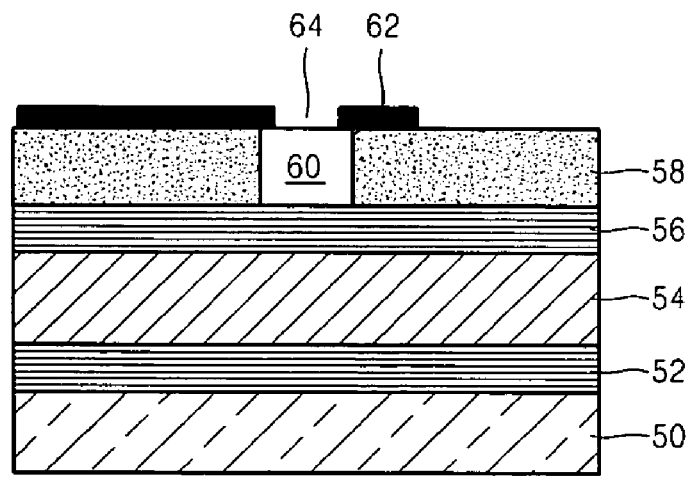

FIGS. 2 through 11 are cross-sectional views illustrating a method of manufacturing the phase change memory device of FIG. 1, and structures thereof. FIGS. 2 through 5 are cross-sectional views for illustrating a method of manufacturing the phase change memory unit of FIG. 1. FIGS. 6 through 8 are cross-sectional views for illustrating a method of manufacturing the laser beam focusing unit of FIG. 1. FIGS. 9 through 11 are cross-sectional views for illustrating a method of manufacturing the semiconductor laser unit of FIG. 1.

First, the method of manufacturing the phase change memory unit 100 of FIG. 1 will be described with reference to FIGS. 2 through 5.

Figure 2:
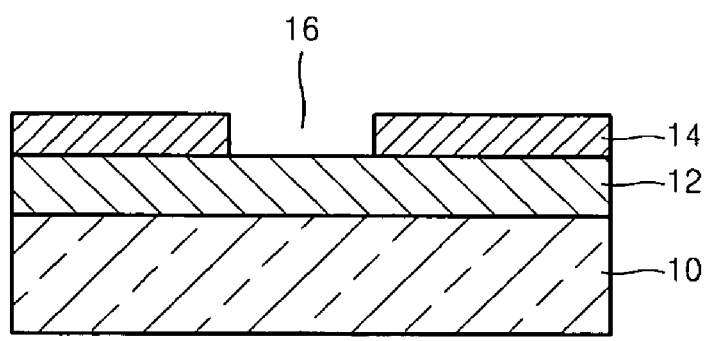
FIGS. 2 through 5 are cross-sectional views for illustrating a method of manufacturing a phase change memory unit of FIG. 1.

Referring to FIG. 2, an electrode 14 having a contact hole 16 and insulating layer 12 are formed on a first substrate 10, for example, a silicon substrate, in which a transistor (not shown) is formed. The insulating layer 12 can be an oxide layer. The contact hole 16 is formed by depositing a metal layer for an electrode on the insulating layer 12 and patterned using a photographic etching process. A phase change layer and a phase change protecting layer will be formed in the contact hole 16 in a subsequent process.

Figure 3:
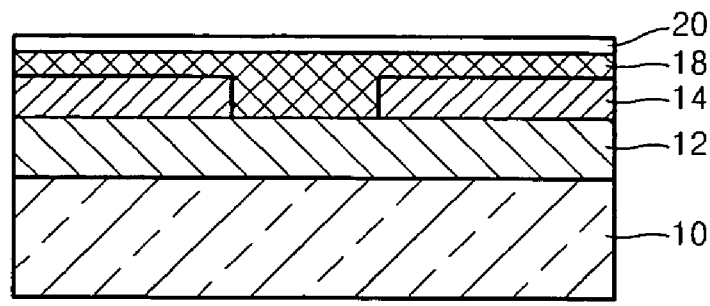

Referring to FIG. 3, a phase change layer 18 and a phase change protecting layer 20 are sequentially formed to fill and cover the contact hole 16 on a front surface of the first substrate 10 in which the insulating layer 12 is formed. The phase change layer 18 is a GST layer. The phase change layer 18 is formed using a sputtering method or a chemical vapor deposition (CVD) method with the effect of excellent step coverage or an atomic layer deposition (ALD) method.

Referring to FIG. 4, the phase change layer 18 and the phase change protecting layer 20 are patterned to sequentially form a phase change layer pattern 18a and a phase change protecting layer pattern 20a in the contact hole 16. Since the phase change layer 18 is formed to fill and cover the contact hole 16 and patterned, the surface of the phase change layer pattern 18a is higher than the surface of the electrode 14, and the phase change layer pattern 18a is electrically connected to the electrode 14.

Referring to FIG. 5, a laser beam shielding pattern 22 having a first laser beam window 24 exposing a portion of the phase change protecting pattern 20a is formed on the electrode 14 and the phase change protecting layer pattern 20a. In the phase change memory device according to the current embodiment of the present invention, laser beams are locally incident on the phase change layer pattern 18a through the first laser beam window 24 provided in the laser beam shielding pattern 22.

The laser beam shielding pattern 22 is formed by forming an insulating layer on the resultant upper surface of the first substrate 10 on which the electrode 14 and the phase change protecting pattern 20a are formed, and then by photographically etching the insulating layer. The insulating layer 12 for the laser beam shielding pattern 22 may be formed using a sputtering method or a CVD or ALD method with excellent step coverage.

Hereinafter, referring to FIGS. 6 through 8, a method of manufacturing the laser beam focusing unit of FIG. 1 will be described.

Referring to FIG. 6, a mask layer is formed and patterned on a second substrate 30, for example, a silicon (Si) substrate or a GaP substrate, to form a mask layer pattern 32 having holes 34. The mask layer pattern 32 is formed by forming a mask layer, for example, a photoresist layer or an oxide layer on the second substrate 30 and then patterning the mask layer. The second substrate 30 below the mask layer pattern 32 is etched in a subsequent process, and the second substrate 30 below the mask layer pattern 32 is not etched and becomes a microprobe.

Referring to FIG. 7, a microprobe 38 and a contact pad 39 are formed in the center and at both ends of the inner cavity 36 by etching the second substrate 38 using the mask layer pattern 32 using as an etching mask. The etching of the second substrate 30 is performed by anisotropic etching, that is, wet etching. Accordingly, the microprobe 38 is formed protruding from the center of the second substrate 30 and contact pads 39 are formed at both ends of the second substrate 30. The microprobe 38 locally transmits a laser beam 80 (shown in FIG. 1) to the phase change layer pattern 18a through the first laser beam window 24 of the phase change memory unit 100.

Referring to FIG. 8, the mask layer pattern 32 is removed. A protecting layer pattern 40 is formed on each of the contact pads 39 formed on both ends of the second substrate 30. The protecting layer pattern 40 is formed in the contact region between the phase change memory unit 100 and the laser beam focusing unit 200. The protecting layer pattern 40 provides a space between the phase change memory unit 100 and the laser beam focusing unit 200.

Next, a method of manufacturing the semiconductor laser unit of FIG. 1 will be described with reference to FIGS. 9 through 11.

Referring to FIG. 9, a first resonating mirror 52 is formed on a third substrate 50, for example, a Si, GaAs or InP substrate. An active zone 54 including quantum wells is formed on the first resonating mirror 52. A second resonating mirror 56 is formed on the active region 54. The first resonating mirror 52 and the second resonating mirror 56 have a multilayer structure in which various layers having different refractive indices are alternately disposed and which each have a reflectivity of 99% or higher.

Each layer forming the first resonating mirror 52 and the second resonating mirror 56 is formed using an epitaxial growth method such as a molecular beam epitaxy (MBE). The laser beam generated in the active zone 54 is reflected by the first and second resonating mirrors 52 and 56 and amplified. A semiconductor layer 58 is formed on the second resonating mirror 56.

Referring to FIG. 10, a laser beam controlling pattern 60 is formed by patterning the semiconductor layer 58 in a region through which a laser beam is to be transmitted. The laser beam controlling pattern 60 is formed to correspond to the microprobe 38 of the laser beam focusing unit 200. The laser beam controlling pattern 60 is for controlling the shape of a laser beam. The laser beam controlling pattern 60 may be an insulating layer or may be formed of other materials.

Next, a connecting plate 62 having a second laser beam window 64 exposing the laser beam controlling pattern 60 for helping the semiconductor layer 58 and the laser beam focusing unit 200 to be easily mechanically connected is formed on the semiconductor layer 58. The second laser beam window 64 is formed on the laser beam controlling pattern 60 corresponding to the microprobe 38.

Next, a method of assembling and coupling the phase change memory device will be described with reference to FIGS. 1, 5, 8, and 11.

In detail, as illustrated in FIG. 5, the phase change memory unit 100 formed on the first substrate 10 is provided. Then, as illustrated in FIG. 8, the laser beam focusing unit 200 formed on the second substrate 30 is turned upside down to couple the laser beam focusing unit 200 to the laser beam shielding pattern 22 of the phase change memory unit 100 of FIG. 5. In other words, the protecting layer pattern 40 of the laser beam focusing unit 200 and the laser beam shielding pattern 22 of the phase change memory unit 100 are coupled. The laser beam focusing unit 200 and the phase change memory unit 100 are coupled such that the microprobe 38 is aligned with the first laser beam window 24. The phase change memory unit 100 and the laser beam focusing unit 200 can be coupled by anodic bonding or directing bonding.

Then, a semiconductor laser unit 300 including the third substrate 50 is turned upside down to be coupled to the laser beam focusing unit 200. In other words, the connecting plate 62 and a rear surface of the second substrate 30 of the laser beam focusing unit 200 are coupled. The semiconductor laser unit 300 and the laser beam focusing unit 200 are coupled such that the laser beam controlling pattern 60 and the microprobe 38 are aligned. The semiconductor laser unit 300 and the laser beam focusing unit 200 can be coupled by anodic bonding or directing bonding.

As described above, the phase change memory device according to the present invention includes a semiconductor laser unit in each unit cell and uses a laser beam to apply heat locally on a phase change layer to perform a set or reset operation, thus reducing the consumption power and preventing destruction or change in information stored in neighboring memory cells due to the heat which is generated during the operation of the unit cells and might affect the neighboring memory cells.

The phase change memory device according to the present invention does not include a heat generation layer unlike conventional phase change memory devices, and thus has a very simple configuration and a reduced consumption power.

Also, the phase change memory device according to the present invention, which is capable of operating at high speeds and at low consumption powers, can be manufactured in a simple manner without complicating the structure of the memory device or using complicated processes which decrease uniformity of the memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase change memory device comprising: a phase change memory unit comprising a phase change layer pattern; a laser beam focusing unit locally focusing a laser beam on the phase change layer pattern of the phase change memory unit; and a semiconductor laser unit generating and emitting the laser beam towards the laser beam focusing unit, wherein the phase change memory unit, the laser beam focusing unit, and the semiconductor laser unit are sequentially stacked and coupled.

2. The phase change memory device of claim 1, wherein a laser beam shielding pattern having a laser beam window is formed on the phase change layer pattern, wherein the laser beam window allows a laser beam to pass therethrough.

3. The phase change memory device of claim 1, wherein the laser beam focusing unit comprises a microprobe that can locally focus a laser beam on the phase change layer pattern.

4. The phase change memory device of claim 1, wherein the semiconductor laser unit comprises a laser beam controlling pattern that can control the shape of an emitted laser beam.

5. A phase change memory device comprising:
   an electrode having a contact hole formed to on a first substrate;
   a phase change layer pattern that is formed in the contact hole and is electrically connected to the electrode;
   a laser beam shielding pattern that is formed on the phase change layer pattern and the electrode and comprises a laser beam window to allow a laser beam to be locally incident on the phase change layer pattern;
   a second substrate that is supported on and coupled to both ends of the laser beam shielding pattern and comprises a microprobe that can allow the laser beam to be transmitted through the laser beam window; and
   a third substrate that is supported on and coupled to a rear surface of the second substrate and comprises a semiconductor layer which generates and emits a laser beam through a laser beam controlling pattern to the microprobe.

6. The phase change memory device of claim 5, wherein a connecting plate, which exposes a portion of the laser beam controlling pattern corresponding to the microprobe, is installed between the second substrate comprising the microprobe and the third substrate comprising the semiconductor laser.

7. The phase change memory device of claim 5, wherein an inner cavity is formed inside the second substrate, and the microprobe protrudes into the middle of the inner cavity, and contact pads are formed at both end portions of the inner cavity.

8. The phase change memory device of claim 7, wherein a protection layer pattern is further formed, which can adjust the distance between the first substrate and the second substrate.

9. The phase change memory device of claim 5, wherein the semiconductor laser comprises an active region formed on the third substrate and a first resonating mirror and a second resonating mirror disposed above and below the active region, and the laser beam controlling pattern is formed on the second resonating mirror.

* * * * *